United States Patent

Assow

[19]

[11] Patent Number: 6,101,107
[45] Date of Patent: Aug. 8, 2000

[54] SNUBBER CIRCUIT, VOLTAGE CONVERTER CIRCUIT AND METHOD IN SUCH A SNUBBER CIRCUIT

[75] Inventor: Bengt Assow, Norsborg, Sweden

[73] Assignee: Telefonaktiebolaget LM Ericsson, Stockholm, Sweden

[21] Appl. No.: 09/254,980

[22] PCT Filed: Sep. 8, 1997

[86] PCT No.: PCT/SE97/01492

§ 371 Date: Mar. 17, 1999

§ 102(e) Date: Mar. 17, 1999

[87] PCT Pub. No.: WO98/12796

PCT Pub. Date: Mar. 26, 1998

[30] Foreign Application Priority Data

Sep. 18, 1996 [SE] Sweden .................................. 9603409

[51] Int. Cl.[7] .................................................. H02M 3/335
[52] U.S. Cl. ............................................. 363/53; 363/126
[58] Field of Search ................................. 363/17, 20, 44, 363/53, 125, 126

[56] References Cited

U.S. PATENT DOCUMENTS

| | | |
|---|---|---|
| 4,805,079 | 2/1989 | Buul . |
| 5,351,179 | 9/1994 | Tsai et al. . |
| 5,535,114 | 7/1996 | Horie et al. . |
| 5,923,547 | 7/1999 | Mao ......................................... 363/52 |
| 5,982,646 | 11/1999 | Lyson et al. ............................... 363/58 |
| 5,986,904 | 11/1999 | Jacobs et al. .............................. 363/53 |

FOREIGN PATENT DOCUMENTS

| | | |
|---|---|---|
| 4421249 A1 | 12/1994 | Germany . |
| WO 94/23488 | 10/1994 | WIPO . |

*Primary Examiner*—Adolf Deneke Berhane
*Attorney, Agent, or Firm*—Burns, Doane, Swecker & Mathis, L.L.P.

[57] ABSTRACT

The present invention relates to a snubber circuit, a voltage converter circuit as well as a method where the voltage converter circuit comprises a coupling element (DF), which can be influenced to conduct and not to conduct and across which the snubber circuit is connected, which comprises a first series circuit comprising a first capacitor (C1) and a first diode (D1) in parallel with at least one second series circuit comprising a second capacitor (C2) and at least one second diode (D2). All capacitors in the snubber circuit form a capacitive series circuit in parallel with the coupling element (DF), which has its beginning in the first capacitor (C1). The second capacitor (C2) is connected to the closest preceding capacitor in the capacitive series circuit via a third diode (D3), such that when a voltage is applied across the coupling element (DF) and this is influenced not to conduct, the capacitors (C1, C2) are charged in series, and when the coupling element thereafter is influenced to conduct, the capacitors are discharged in parallel and the coupling element does not start to conduct until the capacitors have been completely discharged.

18 Claims, 2 Drawing Sheets

SNUBBER CIRCUIT, VOLTAGE CONVERTER CIRCUIT AND METHOD IN SUCH A SNUBBER CIRCUIT

TECHNICAL FIELD

The present invention relates to a snubber circuit, a voltage converter circuit and a method in such a snubber circuit and specifically to a snubber circuit for connection across a coupling, element, a voltage converter circuit comprising such a snubber circuit and a method for reducing transient voltages present across such a coupling element. The invention is mainly meant for use in voltage converter circuits but is not limited to this field.

STATE OF THE ART

A snubber circuit usually comprises a capacitor in series with a resistor connected across a coupling element which can be influenced to conduct and not conduct current in order to reduce transient voltages across the coupling element.

WO-94/23488 discloses a number of snubber circuits in different converter circuits, where each snubber circuit is connected in parallel with a coupling element in the shape of a rectifier diode. These snubber circuits comprise a capacitor in series with a first diode in parallel with the coupling element. The snubber circuits also comprise a coil and a second diode. The object of such a snubber circuit is to ensure that the coupling element does not conduct in the reverse direction when switching occurs. The capacitor in this snubber circuit is mainly meant to handle energy from the coil.

U.S. Pat. No. 4,805,079 discloses a snubber circuit for limiting the voltage across a coupling element in the shape of a field effect transistor. The snubber circuit comprises two capacitors, a first being charged when the coupling element is released and the second simultaneously being discharged. When the coupling element is activated, the charged first capacitor is discharged.

DE-A1-4 421 249 discloses a snubber circuit with two serial circuits, each comprising a capacitor in series with a diode, the serial circuits being connected in parallel with one coupling element each. The serial circuits are also connected via a further serial circuit comprising a diode and a coil. These capacitors are charged and discharged in series, and the circuit is used in order to reduce losses when switching the coupling elements on and off, said coupling elements being connected to the primary side of a transformer, by dealing with the leakage inductance in the primary coil of the transformer.

DESCRIPTION OF THE INVENTION

The present invention addresses a problem of how to reduce transient voltages present across a coupling element, which arise when the coupling element is influenced to conduct.

A preferred embodiment of the invention addresses another problem of how to reduce leakage energy lost in a transformer when switching a voltage converter circuit.

An object of the present invention is thus to provide a method and a device reducing transient voltages present across a coupling element, which arise when the coupling element is influenced to conduct.

A further object of the present invention is to reduce leakage energy lost in a transformer in a voltage converter circuit when switching, so that the efficiency of the converter circuit is increased.

This is accomplished by charging at least two capacitors in series with a voltage applied across the coupling element when the coupling element is influenced not to conduct current, and discharging said capacitors in parallel when the coupling element is influenced to conduct so that the coupling element does not start to conduct until the capacitors are fully discharged.

This is accomplished with a snubber circuit for connection across the coupling element and a voltage converter circuit comprising such a coupling element and such a snubber circuit, the snubber circuit being connected in parallel with the coupling element and comprising a first serial circuit comprising a first capacitor and a first diode, and at least one second serial circuit connected in parallel with the first serial circuit and comprising a second capacitor and at least one second diode. All capacitors form a capacitive serial circuit in parallel with the coupling element, starting with the first capacitor. The second capacitor is connected to the closest preceding capacitor in the capacitive serial circuit via a third diode, such that when a voltage is applied across the coupling element, and this first coupling element is influenced not to conduct current, the capacitors are charged in series, and when the coupling element is influenced to conduct current, the capacitors are discharged in parallel and the coupling element starts to conduct when the capacitors are completely discharged.

This is also accomplished with a method comprising the steps: charging, in series, at least two capacitors with a voltage applied across the coupling element when the coupling element is influenced not to conduct current, and parallel discharging the capacitors when the coupling element thereafter is influenced to conduct current, such that the coupling element starts conducting when the capacitors are fully discharged.

An advantage of the invention is that transient voltages across the coupling element are reduced.

Several advantages are obtained when the snubber circuit according to the invention is connected across a first coupling element in the shape of a rectifier diode, connected to the secondary coil of a transformer in a flyback converter. Firstly, transient voltages arising across said rectifier diode are suppressed, but transient voltages arising across a second coupling element connected to the primary coil of the transformer are also suppressed by this snubber circuit on the secondary side, where the second coupling element is in the shape of a coupling transistor. This provides several further advantages such as a higher efficiency in the converter circuit, reduced losses when the coupling transistor is switched off and reduced losses in the transformer. These reduced transients also provide the additional advantages of not needing to design the coupling transistor and the rectifier diode for such high voltage levels which otherwise would be required, so that smaller and cheaper components can be used. A snubber circuit is obtained, suppressing transients arising across two different coupling elements, and thus one snubber circuit is spared which otherwise might be required across the coupling transistor. Apart from this, a greater output power is also obtained in such a flyback voltage converter circuit.

The invention will now be further described using preferred embodiments and with reference to the annexed drawings.

PREFERRED EMBODIMENTS

Figure 1:
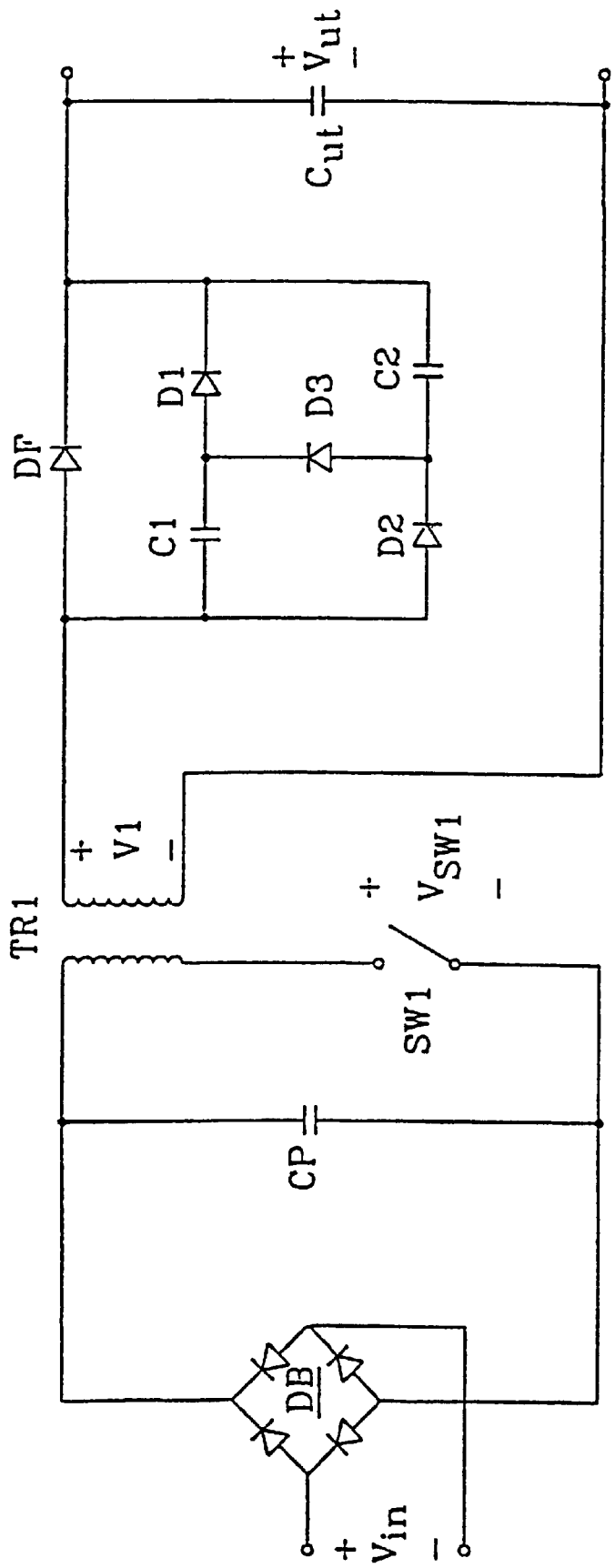
FIG. 1 shows a circuit diagram of a flyback voltage converter circuit comprising a snubber circuit according to the invention.

FIG. 1 shows a circuit diagram of a flyback voltage converter circuit comprising the snubber circuit according to the invention. The voltage converter circuit has an input which also constitutes an input of a rectifier bridge DB. On this input an alternating voltage $V_{in}$ is received from an alternating voltage net (not shown). The diode bridge DB has an output, across which a first storage capacitor CP is connected. In parallel with the first storage capacitor CP a serial circuit is connected comprising a controllable second coupling element SW1 in the shape of a PWM-controlled transistor and the primary coil of a transformer TR1. The transformer TR1 has a secondary coil with a first terminal connected to a first terminal of a second storage capacitor $C_{ut}$ via a first coupling element DF in the shape of a rectifier diode. The secondary coil has a second terminal directly connected to a second terminal of the second storage capacitor $C_{ut}$. The two terminals of the second storage capacitor $C_{ut}$ also constitute an output of the voltage converter circuit, and a load can thus be connected to these. The snubber circuit according to the invention is connected in parallel with the rectifier diode DF, which has a first end or its anode connected to the secondary coil of the transformer TR1, and a second end or its cathode to the second storage capacitor $C_{ut}$. The snubber circuit comprises a first serial circuit comprising a first capacitor C1 in series with a first diode D1 and a second serial circuit comprising a second capacitor C2 in series with a second diode D2, said second serial circuit being connected in parallel with the first serial circuit. A third diode D3 is connected between the connection point between the first capacitor C1 and the first diode D1, and the connection point between the second diode D2 and the second capacitor C2. The first capacitor C1 is further connected to the anode of the rectifier diode DF and to the anode of the first diode D1. Consequently, the cathode of the first diode D1 is connected to the cathode of the rectifier diode DF. The anode of the second diode D2 is connected to the anode of the rectifier diode DF. Finally, the third diode D3 is connected to the first capacitor C1 by its cathode. The first and second capacitors C1 and C2 form, by the contact via the third diode D3, a capacitive circuit in parallel with the first coupling element DF, which starts in the first capacitor C1. Moreover, in the figure, the voltage V1 across the secondary coil of the transformer TR1, the voltage $V_{ut}$ across the second storage capacitor $C_{ut}$ and the voltage $V_{SW1}$ across the second coupling element SW1 are indicated.

The voltage converter circuit substantially operates in the following way. The alternating voltage $V_{in}$ is full-wave rectified in the diode bridge DB and charges the first storage capacitor CP. The first storage capacitor CP is then used as a power supply for the transformer TRI. Current is fed into the transformer TRI each time the second oupling element SW1 is switched on. The current will then come from the first storage capacitor CP when the full-wave rectified input voltage is lower than the voltage across the first storage capacitor CP and otherwise directly from the alternating voltage net. Switching of the second coupling element SW1 is provided by PWM (Pulse Width Modulation), the pulses substantially determined by the voltage across the second storage capacitor $C_{ut}$ or by the current through the second coupling element SW1. All of this is well known to the man skilled in the art. The current supplied by the alternating voltage net or the first storage capacitor CP thus enters the primary coil of the transformer TRI when the second coupling element SW1 is switched on and is transformed in the transformer to substantially feed current to the second storage capacitor $C_{ut}$ when the second coupling element SW1 is released. The second storage capacitor $C_{ut}$ is thus charged by a transformer TR1 and prevented from discharging back into the secondary coil by the first coupling element DF. This is done such that when the second coupling element SW1 is conducting current, and current thus passes through the primary coil of the transformer TR1, the voltage across the primary coil is decreased, said voltage being transformed and thus lowers the voltage V1 across the secondary coil. A voltage difference thereby arises across the first coupling element, equal to the voltage $V_{ut}$ across the second storage capacitor $C_{ut}$ minus the voltage V1 across the secondary coil. The first coupling element DF thus has a potential at its anode determined by the voltage V1 and a potential at its cathode determined by the voltage $V_{ut}$. This voltage difference influences the first coupling element DF not to conduct current. When the second coupling element SW1 subsequently is closed or influenced not to conduct current, the primary coil of the transformer TR1 gets a high voltage transformed to the secondary coil, which secondary coil gets a high voltage level across itself, substantially equalling the voltage $V_{ut}$ across the second storage capacitor $C_{ut}$. This voltage V1 across the secondary coil influences the first coupling element DF to conduct current. The second storage capacitor $C_{ut}$ is then used as a power supply for a load (not shown) connected to the voltage converter circuit. The transformer TR1 ensures that the second storage capacitor $C_{ut}$ is kept at substantially constant output voltage $V_{ut}$. All of this is well known to the man skilled in the art.

Figures 2A, 2B:
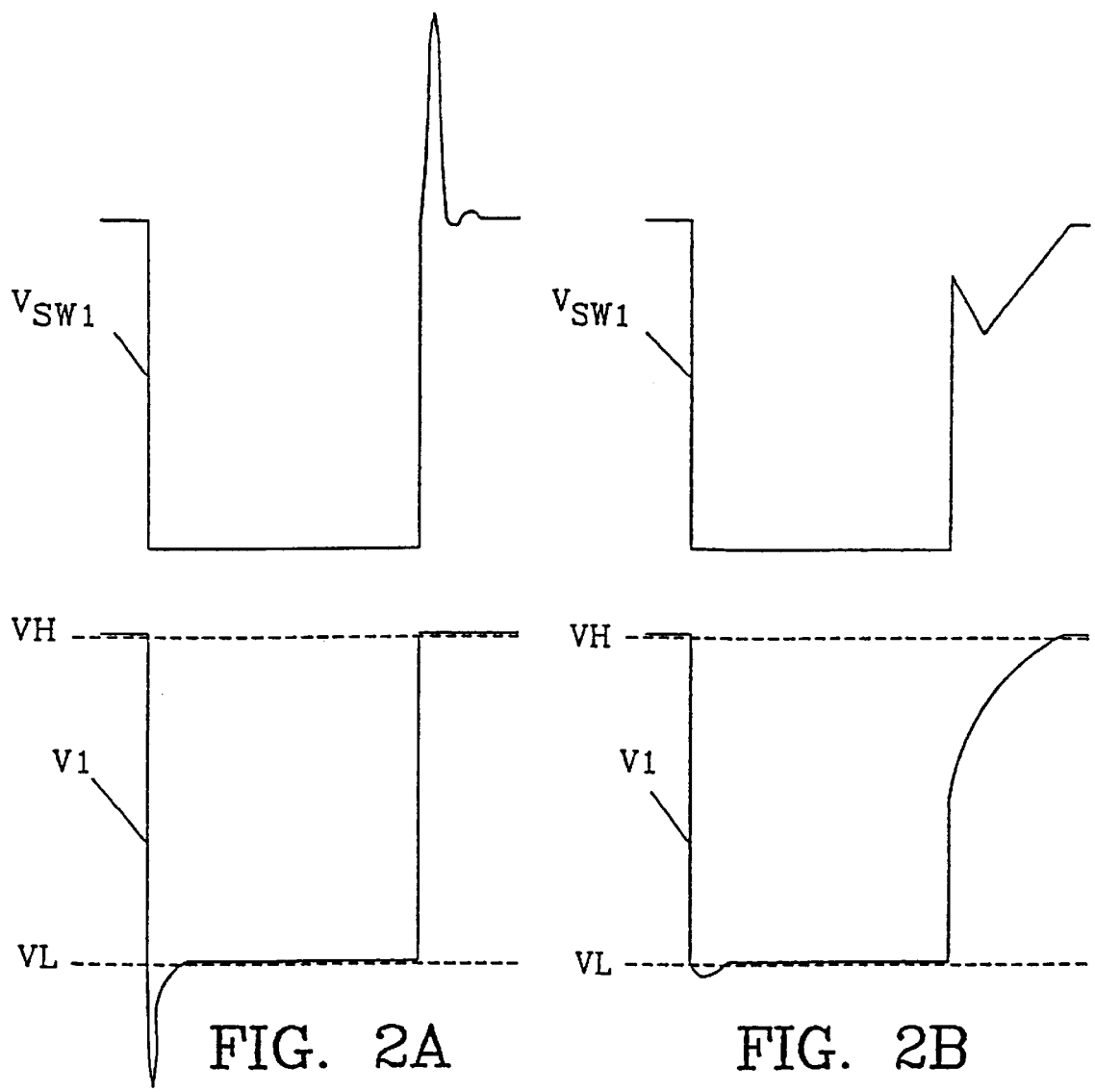
FIG. 2A shows some different voltages arising in a flyback voltage converter circuit lacking a snubber circuit.
FIG. 2B shows the same voltages as in FIG. 2A but for a voltage converter circuit comprising a snubber circuit according to the invention.

The operation of the snubber circuit according to the invention will now be further described with reference to FIGS. 2A and 2B. FIG. 2A shows voltage variations in a flyback voltage converter circuit lacking a snubber circuit. These voltages are measured after charging, i.e. the first and the second storage capacitors CP, $C_{ut}$ are both fully charged to their working level. In this figure the top curve shows a voltage $V_{SW1}$ across the second coupling element SW1 when this is switched on and off. As shown by this curve, a considerable spike shows in the voltage $V_{SW1}$ across this second coupling element SW1 when it is released not to conduct. In a lower curve in FIG. 2A the simultaneously showing voltage V1 across the secondary coil of the transformer TR1 is shown. As shown by this lower curve in FIG. 2A, this secondary coil has a high voltage level VH when the voltage $V_{SW1}$ across the second coupling element SW1 has a high voltage level, and drops to a low level VL at the same time as the coupling means SW1 is switched on. The high voltage level VH is substantially equal to or slightly greater than the voltage $V_{ut}$ across the second storage capacitor. The voltage, however, has a transient at the transit to the low level VL which is considerably lower than this low level VL. Thereafter the low level VL is substantially kept until the second coupling element SW1 is again released, at which time the voltage rises to the high level VH again.

What happens is the following: To start with, the first coupling element DF is influenced to conduct due to the fact that the second coupling element SW1 is released, and the secondary coil has the high voltage level VH across itself, which is substantially equal to the voltage $V_{ut}$ across the second storage capacitor $C_{ut}$. At this time this second storage capacitor $C_{ut}$ is power supplied by the transformer TR1. When the second coupling element SW1 is switched on, the first coupling element DF is influenced not to conduct since the voltage V1 across the secondary coil of the transformer TR1 drops to the low level VL. This first coupling element DF is, however, slow because it is designed to resist high currents for feeding the second storage capacitor $C_{ut}$ and the load, such that it will not cut off directly why, a certain current passes from the second storage capacitor $C_{ut}$ to the transformer TR1. Because of this-reverse current, a voltage transient arises in the lower curve of FIG. 2A. When subsequently the second coupling element SW1 is switched on to influence the first coupling element DF to start conducting again, a considerable voltage transient arises across this second coupling element SW1.

The transients mentioned above cause energy to be lost in the voltage converter circuit and thereby decreases its efficiency. Additionally, components therein such as coupling elements must be selected large enough to withstand the voltage transients arising across them. The transformer also has to be selected to withstand these greater voltages. This leads to the use of unnecessarily large and expensive components in such a circuit. The solution to this is using the snubber circuit according to the invention which will be further explained below with reference to FIGS. 1 and 2B.

FIG. 2B shows corresponding voltages as FIG. 2A. but for a voltage converter circuit comprising the snubber circuit according to the invention. The voltages are in certain respects similar to the voltages shown in FIG. 2A, and therefore only the differences will be described here. The voltage across the second coupling element SW1 is substantially identical to the corresponding curve in FIG. 2A up till where the second coupling element SW1 stops conducting. The voltage does not show any transient when the coupling element SW1 stops conducting but an increase to a certain voltage level, e.g. slightly below the highest voltage level. The voltage then drops somewhat to subsequently rise again to the higher level. This curve thus lacks voltage transient. The curve of the voltage V1 across the secondary coil of the transformer has a considerably reduced transient when the second coupling element starts conducting, and shows, at the time when the second coupling element SW1 is released, an instantaneous voltage rise to about half the voltage level VH and thereafter a voltage rise to this high voltage level VH, i.e. to the same voltage level $V_{ut}$ which is applied across the second storage capacitor $C_{ut}$ or a slightly higher voltage level, because this second storage capacitor has been discharged somewhat in order to power-supply the load.

What happens is the following: When the second coupling element SW1 starts conducting, the voltage V1 across the secondary coil of the transformer drops, as mentioned earlier, to its low level VL and thereby a voltage drop arises across the first coupling element DF, such that this is influenced not to conduct current. The voltage difference between the voltage $V_{ut}$ across the second storage capacitor $C_{ut}$ and the voltage V1 across the secondary coil of the transformer TR1 generates a current substantially charging the first and second capacitor C1 and C2 in series via the third diode D3. These capacitors have in this embodiment the same size and therefore half the voltage difference is across the first capacitor and half the voltage difference across the second capacitor. These capacitors thus substantially absorb all the energy stored in a leakage inductance existing between the primary and secondary coils of the transformer, said energy having arisen because of the delay of the rectifier diode DF and the current flowing in the reverse direction in this rectifier diode DF at the release. When the second coupling element SW1 stops conducting current, the voltage V1 across the secondary coil of the transformer TR1 rises instantaneously to about half the high level VH, when the first and second capacitors C1 and C2 start discharging in the direction towards the second storage capacitor $C_{ut}$. The charge in the first and second capacitors C1 and C2 is thus used for charging the second storage capacitor $C_{ut}$ and can thus be used in the load. At this time the voltage V1 across the secondary coil added to the voltage across the first capacitor C1 is substantially equal to the voltage $V_{ut}$ across the second storage capacitor $C_{ut}$. The discharge of the first and second capacitor C1 and C2 occurs in parallel and is shown by the increase in the voltage in the lower curve of FIG. 2B. This prevents the first coupling element DF from starting to conduct and it will not conduct until the first and second capacitors C1 and C2 have been completely discharged. This discharge of the capacitors in turn slows down the voltage rise across the primary side of the transformer TR1, which shows in the voltage $V_{SW1}$ across the second coupling element SW1. Thereby the considerable voltage transient which would otherwise show across this second coupling element is prevented.

With the snubber circuit according to the invention not only a reduction of voltage transients arising across the first coupling element, to which the snubber circuit is connected, is provided but also of the voltage transients arising across another coupling element, the second. This means that simpler and cheaper circuits can be used as coupling elements and that a simpler and cheaper transformer can be used than what would otherwise be the case in flyback voltage converter circuits. Additionally, an extra snubber circuit, which would otherwise be needed across the second coupling element, can be saved.

The invention can be varied in many ways. One way is to use several capacitors charged in series and discharged in parallel. Such a variant of the snubber circuit is shown in FIG. 3.

Figure 3:
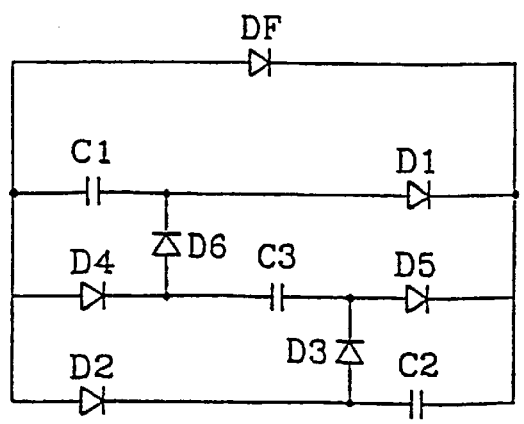
FIG. 3 shows an alternative embodiment of the snubber circuit according to the invention.

The snubber circuit shown in FIG. 3 has been altered in such a way, compared to the snubber circuit of FIG. 1, that apart from the components in the snubber circuits of FIG. 1, it also comprises a third serial circuit comprising a fourth diode D4 connected to the anode of the first coupling element DF by its anode and to a third capacitor C3 by its cathode, said third capacitor C3 being connected to the anode of a fifth diode D5, the cathode of said fifth diode D5 being connected to the cathode of the first coupling element DF. The third diode D3 is connected by its cathode to the connection point between the third capacitor C3 and the fifth diode D5 instead of to the connection point between the first diode D1 and the first capacitor C1, as in FIG. 1. A sixth diode D6 has been connected by its anode to the connection point between the fourth diode D4 and the third capacitor C3 in the third serial circuit, and by its cathode to the connection point between the first diode D1 and the first capacitor C1 in the first serial circuit.

This snubber circuit works such that the three capacitors C1, C2 and C3 form a capacitive serial circuit starting in the first capacitor C1 and ending in the second capacitor C2, and where the third capacitor C3 is in the middle. The capacitors are charged in series and discharged in parallel. What differs in this embodiment from the first is that the parallel discharge occurs at a later stage of the voltage curve and starts at a higher voltage level than what is shown in FIG. 2B, which is substantially ⅔ of the high voltage level of the voltage across the secondary coil, and therefore a shorter discharge period can be obtained.

It is of course possible to connect more serial circuits like the third between the first and second serial circuit. What is most important is that the diode connecting a capacitor higher up in the series with a capacitor lower down in the series is connected between the capacitor higher up in the series at its connection point with a diode connected to the anode of the first coupling element, and is connected to the capacitor lower down in the series at its connection point with a diode connected to the cathode of the first coupling element. The voltage level where the capacitors start to discharge is then increased in dependence of the number of capacitors. Four capacitors make a discharge start at ¾ of the high voltage level across the secondary coil, five capacitors at ⅘ of the high voltage level and so on.

The snubber circuit can also be varied by selecting the values of the capacitors to be different and then the capacitors start to conduct at different levels of the voltage across the secondary coil of the transformer and at least one starts to discharge before the other capacitors.

The capacitors in the snubber circuit are designed according to the leakage inductance of the transformer and to reduce the interference, the first storage capacitor according to the cycle time of the alternating voltage mains and the second storage capacitor according to the ripple current from the first coupling element. This means that the capacitors in the snubber circuit are much smaller than the storage capacitors. The diodes in the snubber circuit are also much smaller and faster than the diode used for the first coupling element, since the currents entering the snubber circuit, due to the smaller capacitors, are much smaller than the currents in the rest of the voltage converter circuit.

The invention is not limited to flyback voltage converter circuits but can also be used in other forms of voltage converter circuits. The snubber circuit is neither limited to use in voltage converter circuits, but can be used anywhere coupling elements of any type are used. The first coupling element need not be a diode either, it can also be a transistor, thyristor or any other type of coupling element.

The invention is thus not limited to the embodiments above described and shown in the drawings but can be modified within the scope of the annexed claims.

What is claimed is:

1. Snubber circuit for connection across a first coupling element (DF) which can be influenced to conduct and not to conduct current and comprising a first serial circuit comprising a first capacitor (C1) and a first diode (D1), said first serial circuit being connected in parallel with the first coupling element, characterized by at least one second serial circuit connected in parallel with the first serial circuit and comprising a second capacitor (C2) and at least one second diode (D2), all capacitors forming a capacitive serial circuit in parallel with the first coupling element (DF) starting with the first capacitor (C1), the second capacitor (C2) being connected to the closest preceding capacitor in the capacitive serial circuit via a third diode (D3), such that when a voltage is applied across the first coupling element (DF) and this first coupling element is influenced not to conduct current, the capacitors (C1,C2) are charged in series, and when the first coupling element subsequently is influenced conduct current, the capacitors are discharged in parallel and the first coupling element starts to conduct once the capacitors are fully discharged.

2. Snubber circuit according to claim 1, characterized in that the coupling element (DF) has a first and a second end, the first diode (D1) being connected to the second end and the second diode (D2) to the first end.

3. Snubber circuit according to claim 2, characterized in that the first diode (D1) is connected to the second end via its cathode and the second diode (D2) to the first end via its anode.

4. Snubber circuit according to claim 1 characterized by at least one third serial circuit in parallel with the first coupling element (DF) and comprising a third capacitor (C3) connected between a fourth diode (D4) and a fifth diode (D5), said third capacitor being connected, in the capacitive serial circuit, between the first and second capacitors (C1, C2) and to the closest preceding capacitor via a sixth diode (D6).

5. Snubber circuit according to claim 1 characterized in that the first coupling element (DF) only conducts current from the first to the second end.

6. Snubber circuit according to claim 1 characterized in that the first coupling element (DF) is comprised in a voltage converter circuit.

7. Snubber circuit according to claim 1, characterized in that the first coupling element (DF) is a diode connected to the secondary coil of a transformer (TR1) in a flyback converter circuit.

8. Voltage converter circuit comprising a first coupling element (DF) which can be influenced to conduct and not to conduct current and across which a snubber circuit is connected, said snubber circuit comprising a first serial circuit comprising a first capacitor (C1) and a first diode (D1), said first serial circuit being connected in parallel with the first coupling element, characterized by at least one second serial circuit connected in parallel with the first serial circuit and comprising a second capacitor (C2) and at least a second diode (D2), all capacitors in the snubber circuit forming a capacitive serial circuit in parallel with the first coupling element (DF) starting with the first capacitor (C1), the second capacitor (C2) being connected to the closest preceding capacitor in the capacitive serial circuit via a third diode (D3), such that when a voltage is applied across the first coupling element (DF) and this first coupling element is influenced not to conduct current, the capacitors (C1,C2) are charged in series, and when the first coupling element subsequently is influenced to conduct current, the capacitors are discharged in parallel and the first coupling element starts to conduct once the capacitors have been fully discharged.

9. Voltage converter circuit according to claim 8, characterized in that the voltage converter circuit is of flyback type, comprising a transformer (TR1) and that the first coupling element (DF) is a diode connected to a secondary coil of this transformer.

10. Voltage converter circuit according to claim 8, characterized by a second coupling element (SW1) connected to the first coupling element via a primary coil of the transformer (TR1).

11. Method to reduce transient voltages present across a first coupling element (DF) arising when the first coupling element is influenced to start to conduct current, and wherein the first coupling element can be influenced to conduct and not to conduct current, characterized by charging in series at least two capacitors (C1,C2) with a voltage applied across the first coupling element when this first coupling element is influenced not to conduct current and discharging the capacitors in parallel when the first coupling element subsequently is influenced to conduct current, such that the first coupling element starts to conduct once the capacitors have been fully discharged.

12. Method according to claim 11, characterized in that a first end of the first coupling element (DF) has a voltage potential (V1) varying between a first lower level (VL) and a second higher level (VH), that a second end of the first coupling element has a voltage potential ($V_{ut}$) substantially equal to or slightly lower than the higher voltage level (VH), that the voltage applied across the first coupling element equals the voltage potential at the second end minus the voltage potential at the first end, that the first coupling element conducts current in a direction from the first to the second end and that the capacitors are discharged in the same direction as the direction in which the first coupling element conducts current.

13. Method according to claim 12, characterized in that the charging in series comprises charging of the capacitors (C1,C2) to equal voltage levels and the parallel discharge comprises that the discharge is started substantially at the same time for all capacitors when the voltage potential (VH) at the first end of the first coupling element added to the voltage across any of the capacitors is substantially equal to the voltage potential at the other end ($V_{ut}$).

14. Method according to claim 12, characterized in that the charging in series comprises charging of at least one first capacitor to a voltage level higher than the voltage levels across the other capacitors and the parallel discharge comprises that said first capacitor or capacitors are first discharged when the voltage potential at the first end of the first coupling element added to the voltage across said first capacitor or capacitors is substantially equal to the voltage potential at the other end, until the voltage across it or them has dropped to a voltage level equal to that across at least one of the capacitors, whereafter the first and second capacitors are discharged in parallel with each other.

15. Method according to claim 12, characterized in that the voltage variations at the first end of the first coupling element (DF) are provided by a pulse-shaped voltage variation ($V_{SW1}$) generated by a controllable second coupling element (SW1) which has been transformed.

16. Snubber circuit for connection across a first coupling element which can be influenced to conduct and not to conduct current and comprising a first serial circuit comprising a first capacitor and a first diode, said first serial circuit being connected in parallel to the first coupling element; and at least one second serial circuit connected in parallel to the first serial circuit and comprising a second capacitor and at least one second diode; all capacitors forming a capacitive serial circuit in parallel to the first coupling element and starting with the first capacitor;

the second capacitor being connected to the closest preceding capacitor in the capacitive serial circuit via a third diode, such that when a voltage is applied across the first coupling element and this first coupling element is influenced not to conduct current, the capacitors are charged in series, and when the first coupling element subsequently is influenced to conduct current, the capacitors are discharged in parallel and the first coupling element starts to conduct once the capacitors have been fully discharged.

17. Voltage converter circuit comprising a first coupling element which can be influenced to conduct and not to conduct current and over which a snubber circuit is connected, said snubber circuit comprising a first serial circuit connected in parallel with the first coupling element and comprising a first capacitor and a first diode; and at least one second serial circuit connected in parallel with the first serial circuit and comprising a second capacitor and at least one second diode;

all capacitors in the snubber circuit forming a capacitive serial circuit in parallel with the first coupling element, starting with the first capacitor;

the second capacitor being connected to the closest preceding capacitor in the capacitive serial circuit via a third diode, such that when a voltage is applied across the first coupling element, and this first coupling element is influenced not to conduct current, the capacitors are charged in series, and when the first coupling element subsequently is influenced to conduct current, the capacitors are discharged in parallel and the first coupling element starts to conduct once the capacitors have been fully discharged.

18. Method to reduce transient voltages present across a first coupling element arising when the first coupling element is influenced to start to conduct current, and where the first coupling element can be influenced to conduct and not to conduct current, and comprising the steps:

charging in series at least two capacitors to a voltage which is applied across the first coupling element when this first coupling element is influenced not to conduct current; and discharging, in parallel, the capacitors when the first coupling element subsequently is influenced to conduct current, such that the first coupling element starts to conduct once the capacitors have been fully discharged.

* * * * *